United States Patent
Lin et al.

(10) Patent No.: US 12,034,058 B2
(45) Date of Patent: Jul. 9, 2024

(54) GATE STACK TREATMENT FOR FERROELECTRIC TRANSISTORS

(71) Applicant: TAIWAN SEMICONDUCTOR MANUFACTURING CO., LTD., Hsinchu (TW)

(72) Inventors: Cheng-Ming Lin, Kaohsiung (TW); Sai-Hooi Yeong, Zhubei (TW); Ziwei Fang, Hsinchu (TW); Chi On Chui, Hsinchu (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/129,961

(22) Filed: Apr. 3, 2023

(65) Prior Publication Data
US 2023/0238443 A1    Jul. 27, 2023

Related U.S. Application Data

(60) Continuation of application No. 17/228,415, filed on Apr. 12, 2021, now Pat. No. 11,621,338, which is a
(Continued)

(51) Int. Cl.
| | |
|---|---|
| H01L 29/51 | (2006.01) |
| H01L 21/02 | (2006.01) |
| H01L 21/28 | (2006.01) |
| H01L 27/088 | (2006.01) |
| H01L 29/66 | (2006.01) |
| H01L 29/78 | (2006.01) |

(52) U.S. Cl.
CPC ...... *H01L 29/516* (2013.01); *H01L 21/02356* (2013.01); *H01L 21/28176* (2013.01); *H01L 27/0886* (2013.01); *H01L 29/66795* (2013.01); *H01L 29/6684* (2013.01); *H01L 29/78391* (2014.09); *H01L 29/785* (2013.01); *H01L 29/7851* (2013.01)

(58) Field of Classification Search
CPC ............. H01L 29/516; H01L 29/78391; H01L 29/66795; H01L 29/785; H01L 29/7851; H01L 29/6684; H01L 27/0886; H01L 21/02356
See application file for complete search history.

(56) References Cited

U.S. PATENT DOCUMENTS

| | | | | |
|---|---|---|---|---|
| 2016/0379831 A1* | 12/2016 | Yeo | ................ | H01L 29/4966 438/591 |
| 2017/0141112 A1 | 5/2017 | Ching et al. | | |

(Continued)

FOREIGN PATENT DOCUMENTS

| | | |
|---|---|---|
| CN | 106098556 A | 11/2016 |
| CN | 106298540 A | 1/2017 |

*Primary Examiner* — Joseph C. Nicely
(74) *Attorney, Agent, or Firm* — Sterne, Kessler, Goldstein & Fox P.L.L.C.

(57) ABSTRACT

The present disclosure describes a device that is protected from the effects of an oxide on the metal gate layers of ferroelectric field effect transistors. In some embodiments, the device includes a substrate with fins thereon; an interfacial layer on the fins; a crystallized ferroelectric layer on the interfacial layer; and a metal gate layer on the ferroelectric layer.

20 Claims, 11 Drawing Sheets

Related U.S. Application Data division of application No. 16/573,498, filed on Sep. 17, 2019, now Pat. No. 10,978,567.

(56) References Cited

U.S. PATENT DOCUMENTS

| | | |
|---|---|---|
| 2017/0162702 A1 | 6/2017 | Hu |
| 2017/0170027 A1 | 6/2017 | Hou et al. |
| 2017/0250268 A1 | 8/2017 | Hsiao et al. |
| 2020/0365733 A1 | 11/2020 | Song |
| 2022/0052201 A1 | 2/2022 | Yeong et al. |
| 2022/0115513 A1 | 4/2022 | Yin et al. |

* cited by examiner

400

┌─────────────────────────────────────────┐
│  Deposit an interfacial layer on a fin  │ ～ 410
└─────────────────────────────────────────┘
                    ▼
┌─────────────────────────────────────────┐
│ Deposit a ferroelectric layer on the    │
│ interfacial layer                       │ ～ 420
└─────────────────────────────────────────┘
                    ▼
┌─────────────────────────────────────────┐
│ Deposit a metal gate layer on the       │
│ ferroelectric layer                     │ ～ 430
└─────────────────────────────────────────┘
                    ▼
┌─────────────────────────────────────────┐
│ Expose the deposited metal gate layer   │
│ to a treatment with a metal-halide gas  │ ～ 440
└─────────────────────────────────────────┘
                    ▼
┌─────────────────────────────────────────┐
│ Perform a post metallization annealing  │
│ (PMA) in-situ with the halide-gas       │ ～ 450
│ treatment                               │
└─────────────────────────────────────────┘

FIG. 4

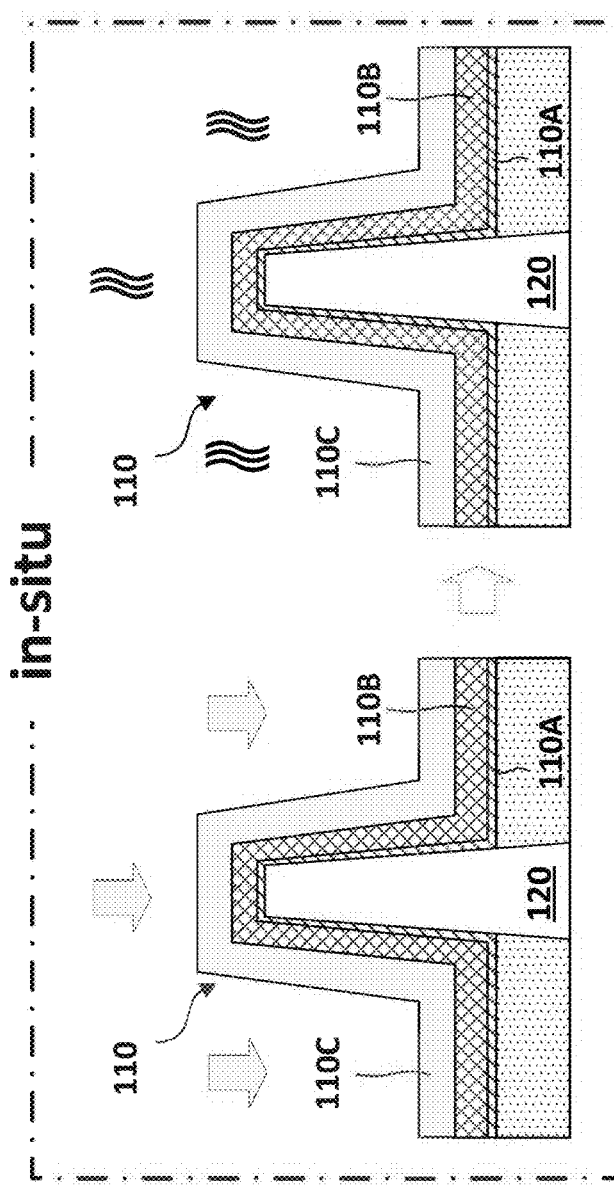

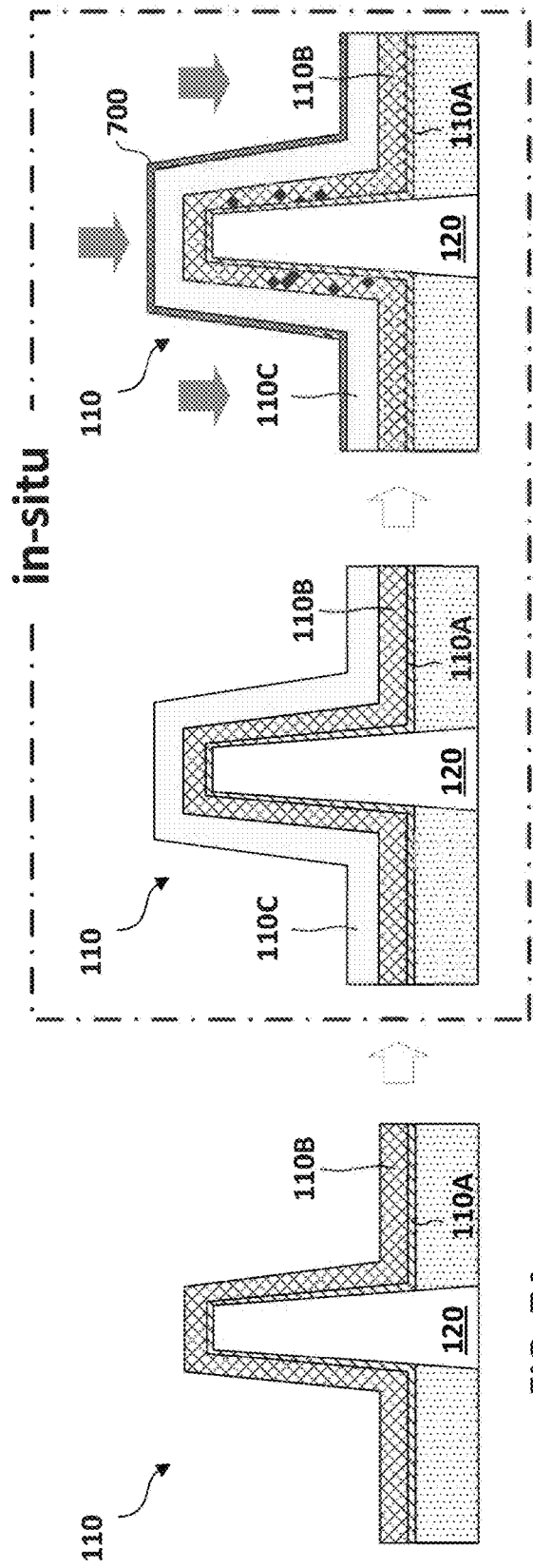

800

```
┌─────────────────────────────────────────────┐
│ Deposit an interfacial layer and a internal │ ~ 810
│         metal gate layer on a fin           │
└─────────────────────────────────────────────┘
                      ▼
┌─────────────────────────────────────────────┐
│ Expose the deposited internal metal gate    │ ~ 820
│ layer to a treatment with a metal-halide gas│
└─────────────────────────────────────────────┘
                      ▼
┌─────────────────────────────────────────────┐
│  Deposit a ferroelectric layer on the       │
│  treated internal metal gate layer without  │ ~ 830
│             a vacuum break                  │
└─────────────────────────────────────────────┘
                      ▼
┌─────────────────────────────────────────────┐
│   Deposit a metal gate layer on the         │ ~ 840
│             ferroelectric layer             │
└─────────────────────────────────────────────┘
                      ▼
┌─────────────────────────────────────────────┐
│ Expose, without a vacuum break, the deposited│
│ metal gate layer to a treatment with silicon-│ ~ 850
│ containing gas to deposit a silicon-based    │
│ capping layer on the metal gate layer        │
└─────────────────────────────────────────────┘
                      ▼
┌─────────────────────────────────────────────┐
│  Perform a post metallization annealing (PMA)│ ~ 860
└─────────────────────────────────────────────┘
```

FIG. 8

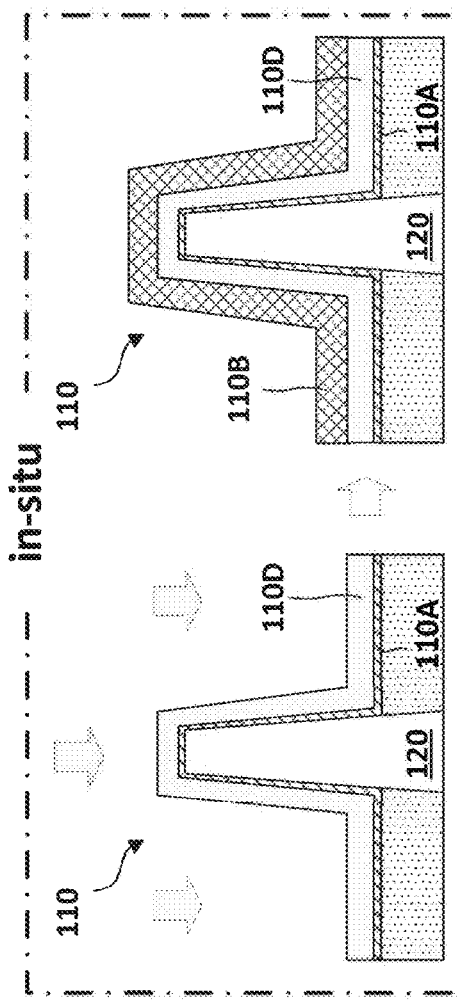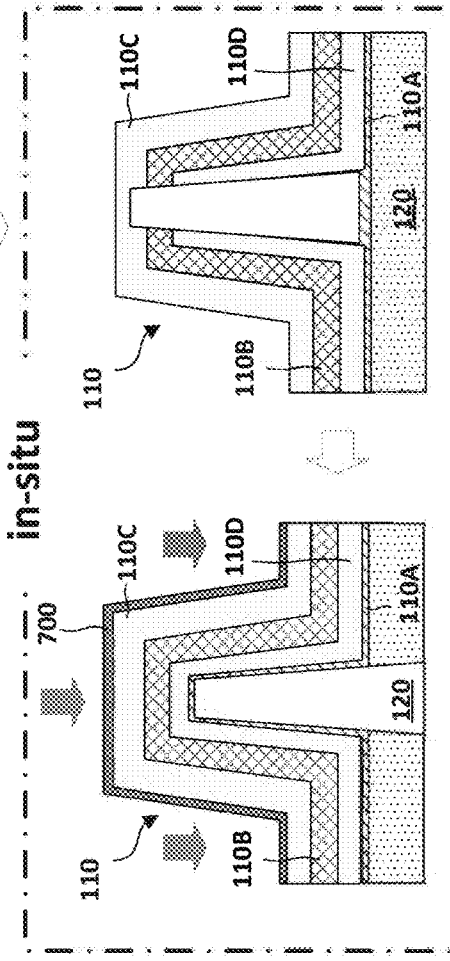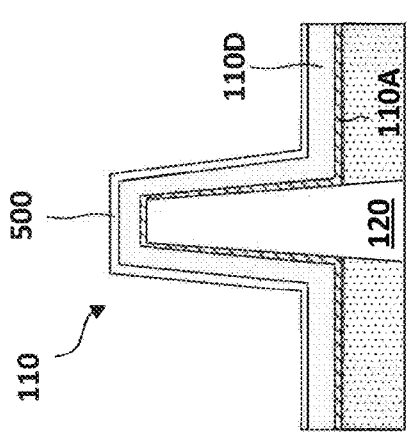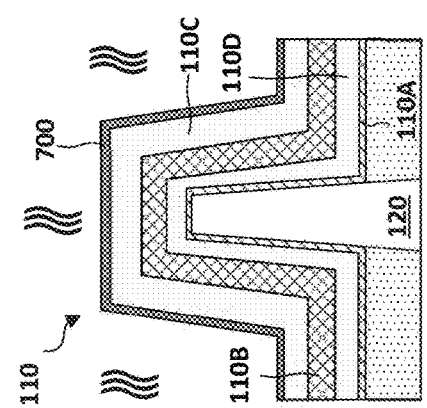

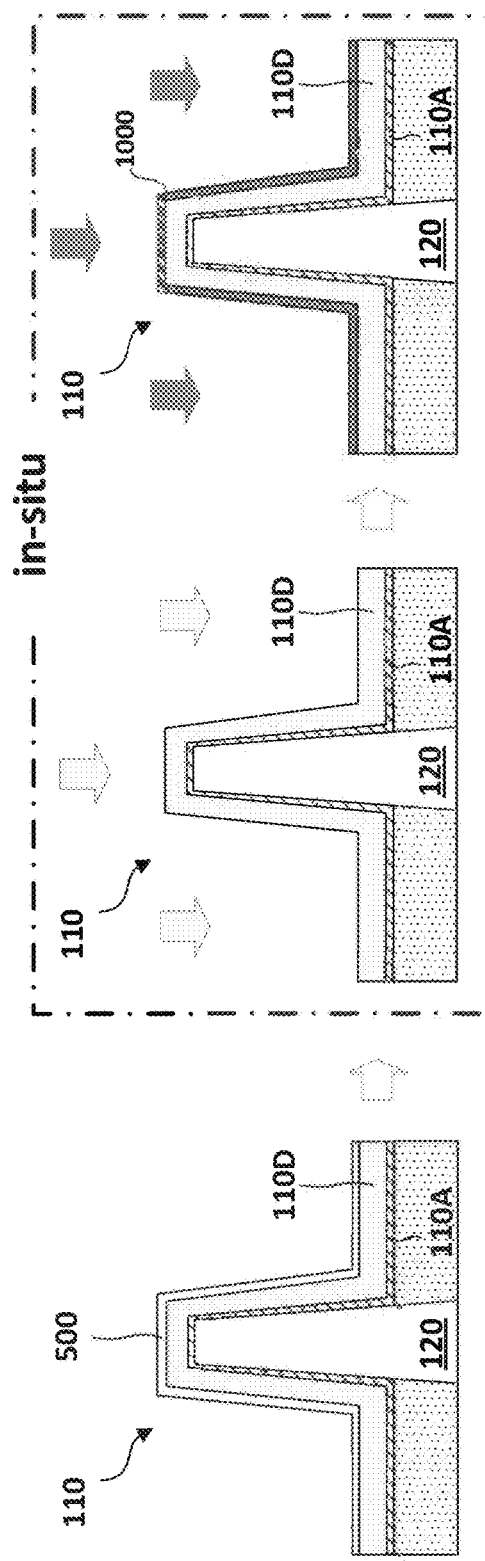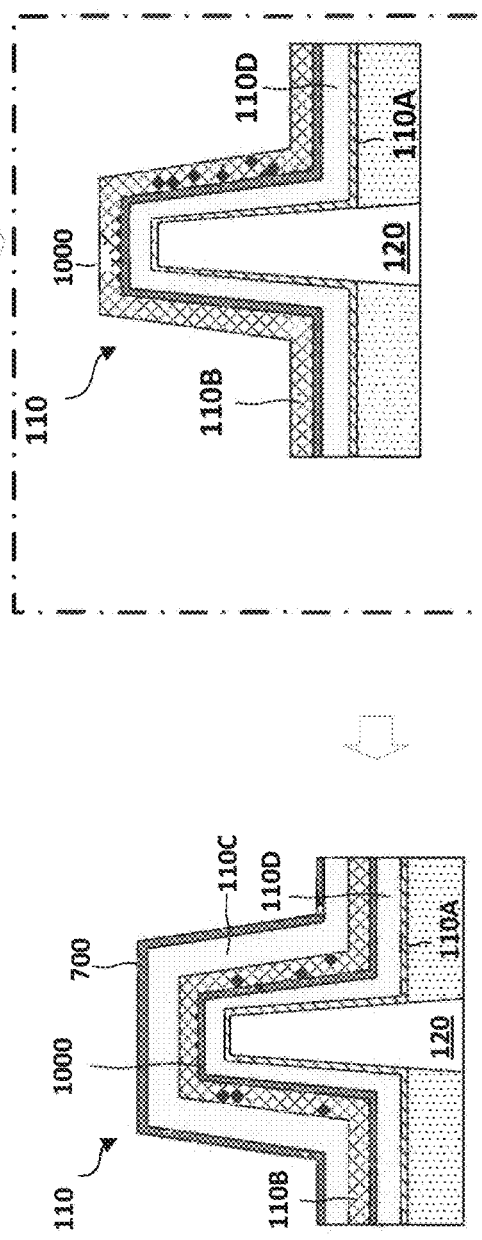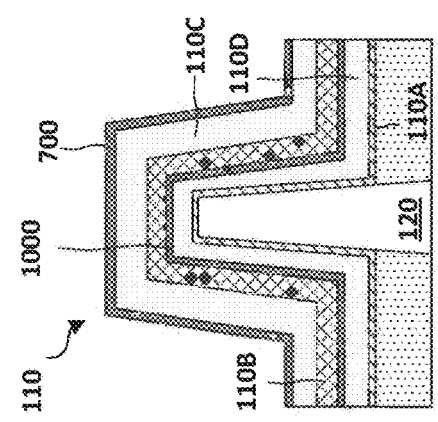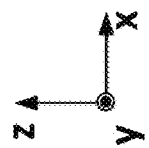

GATE STACK TREATMENT FOR FERROELECTRIC TRANSISTORS

CROSS-REFERENCE TO RELATED APPLICATION

This application is a continuation of U.S. patent application Ser. No. 17/228,415, titled "Gate Stack Treatment for Ferroelectric Transistors," filed Apr. 12, 2021, which is a divisional of patent application Ser. No. 16/573,498, titled "Gate Stack Treatment for Ferroelectric Transistors," filed Sep. 17, 2019, each of which is incorporated by reference herein in its entirety.

BACKGROUND

Metal oxide semiconductor field effect transistor (MOSFET) scaling has been a preferred design choice to increase the performance of silicon complementary metal oxide semiconductor (CMOS) technology in terms of speed and power consumption. However, MOSFETs have a subthreshold voltage swing that is limited to an ideal value of, for example, 60 mV/decade. Due to this limitation, obtaining additional drive voltage and power consumption benefits from scaling can be challenging.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIG. 4 is a flow chart of a method for eliminating or mitigating the formation of a metal oxide on a metal gate layer of a gate stack of a partially fabricated ferroelectric field effect transistor, in accordance with some embodiments.

FIGS. 5A-C are cross-sectional views of a gate stack of a partially fabricated ferroelectric field effect transistor during various fabrication operations, in accordance with some embodiments.

FIGS. 7A-D are cross-sectional views of a gate stack of a partially fabricated ferroelectric field effect transistor during various fabrication operations, in accordance with some embodiments.

FIG. 8 is a flow chart of a method for eliminating or mitigating the formation of a metal oxide on a metal gate layer of a gate stack of a partially fabricated ferroelectric field effect transistor, in accordance with some embodiments.

FIGS. 9A-F are cross-sectional views of a gate stack of a partially fabricated ferroelectric field effect transistor during various fabrication operations, in accordance with some embodiments.

FIGS. 10A-E are cross-sectional views of a gate stack of a partially fabricated ferroelectric field effect transistor during various fabrication operations, in accordance with some embodiments.

DETAILED DESCRIPTION

Figure 1:
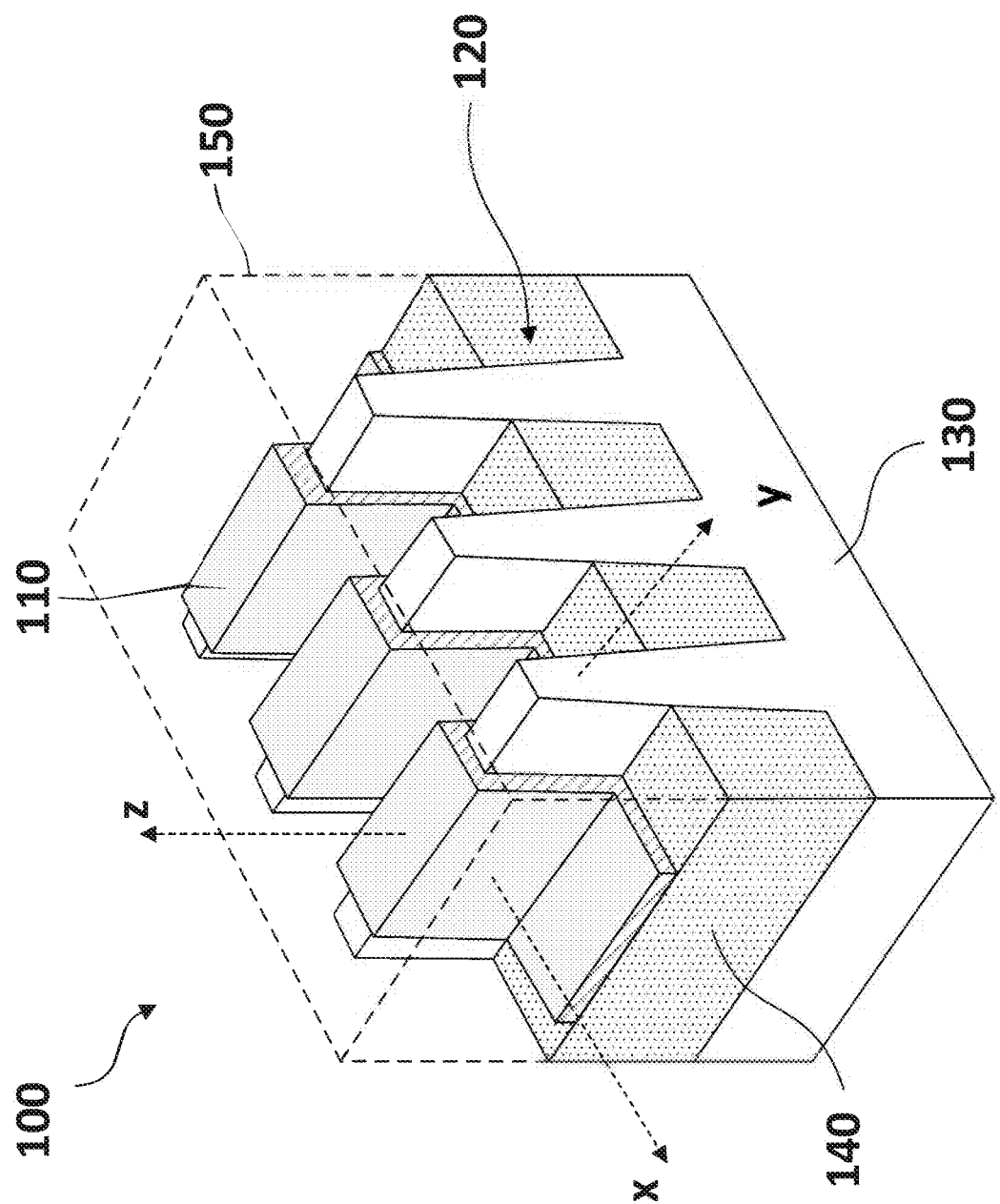
FIG. 1 is an isometric view of a partially fabricated ferroelectric field effect transistor, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

The term "vertical," as used herein, means nominally perpendicular to the surface of a substrate.

In integrated circuits (ICs) with a high density of transistors per unit area, heat generation and dissipation can be challenging. A way to control the heat generation in circuitries with large device densities is to reduce the power consumed by the metal oxide field effect transistors (MOSFETs). Since the drive voltage of a MOSFET exhibits a quadratic power dependence, reduction of the drive voltage would lower the power consumed by the MOSFETs. However, lowering the drive voltage will also reduce the on-state current and decrease the ratio between the on-state current and the off-state current. A way to reduce the MOSFETs drive voltage, but to maintain the transistor's on-state to off-state current ratio, is to reduce the MOSFET's sub threshold swing. However, at room temperature, the subthreshold swing for a MOSFET is fixed at, for example, 60 mV/decade and poses a fundamental limit to power scaling.

Introducing a ferroelectric material into the gate stack of a transistor—e.g., by forming a negative capacitance FET ("NC-FET") or ferroelectric ("FeFET")—can reduce the subthreshold voltage swing of the transistor below the threshold of the 60 mV/decade. As a result, a FeFET requires lower operating voltages to produce the same current density as a MOSFET and uses less power—which results in improved battery life, lower energy costs, and less heat generation. Further, a FeFET exhibits lower off-current compared to a MOSFET due to its steeper subthreshold voltage swing (e.g., <60 mV/decade).

The addition of a ferroelectric material in the gate stack of a transistor is not a trivial task and has its own integration challenges. For example, the unintentional formation of a metal oxide layer on outer surfaces of a metal gate electrode disposed on the ferroelectric material (e.g., due to vacuum breaks between processing operations) can become an oxygen diffusion source for an oxide layer formed at the interface between the metal gate electrode and the ferroelectric material during a subsequent annealing process like a post metallization annealing (PMA) process. The interfacial metal oxide can depolarize the ferroelectric material, increase the gate resistance, and compromise the FeFET's electrical performance. Therefore, elimination of the interfacial oxide between the metal gate electrode and the ferroelectric material is necessary to achieve improved device performance and reliability.

Embodiments of the present disclosure are directed to methods that can eliminate or minimize the formation of an interfacial oxide between the metal gate layers and the ferroelectric layer by preventing the formation of a metal oxide layer on the surfaces of the metal gate layer due to vacuum breaks during the gate stack formation. In some embodiments, the method described herein includes a metal-halide gas treatment that removes the metal oxide formed on the metal gate layer prior to a PMA process. In some embodiments, the metal-halide gas treatment and the PMA process are performed in-situ (e.g., without a vacuum break). In some embodiments, if the PMA process is performed ex-situ, the metal gate layer is subjected to a silicon-contained gas treatment to form a protective silicon-based capping layer on the gate metal layer prior to the ex-situ PMA process. In some embodiments, if the FeFET includes an internal metal gate layer, the internal metal gate layer is subjected to a metal-halide gas treatment to remove metal oxide formed on the internal metal gate layer after the internal metal gate layer deposition. Later in the process, an external metal gate layer can be subjected to a silicon-contained gas treatment to form silicon-based capping layer prior to an ex-situ PMA process. Alternatively, the internal metal gate layer can be subjected to a metal-halide gas treatment followed by a silicon-contained gas treatment that forms a silicon-based capping layer prior to the formation of the ferroelectric layer. In some embodiments, the methods described herein are applicable to several types of transistors, such as finFETs and gate all around (GAA) FETs (e.g., nano-sheet FETs and/or nano-wire FETs).

According to some embodiments, FIG. 1 is an isometric view of a partially fabricated NC-FET or FeFET 100 ("FeFET 100") having a gate stack 110 disposed on fins 120, which are respectively formed on a substrate 130. By way of example and not limitation, FeFET 100 is depicted in FIG. 1 as a finFET structure, however this is not limiting and FeFET 100 can be a GAA FET, such as a nano-sheet FET and/or a nano-wire FET. Further, FIG. 1 shows selected portions of partially fabricated FeFET 100 and other portions are omitted for simplicity. For example, FeFET 100 includes elements not shown in FIG. 1, such as the individual layers or additional layers of gate stack 110, doped regions in fins 120, etc. The layers in gate stack 110 will be discussed in reference to FIG. 2.

As shown in FIG. 1, fins 120 are disposed on substrate 130 and are formed perpendicular to a top surface of substrate 130. Fins 120 are electrically isolated from each other via isolation regions 140, which further isolate gate stack 110 from substrate 130. Additionally, a dielectric layer 150, which is disposed on isolation regions 140, surrounds gate stack 110, as shown in FIG. 1.

By way of example and not limitation, substrate 130 can be a bulk semiconductor wafer (e.g., silicon wafer) or a top layer of a semiconductor-on-insulator wafer a silicon layer of a silicon-on-insulator). In some embodiments, fins 120 can include (i) silicon, (ii) a compound semiconductor such as gallium arsenide (GaAs), gallium nitride (GaN), gallium phosphide (GaP), indium phosphide (InP), indium arsenide (InAs), and/or indium antimonide (InSb), silicon germanium (SiGe), (iii) an alloy semiconductor including, gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof.

By way of example and not limitation, isolation regions 140 can be shallow trench isolation (STI) structures that include a silicon-based dielectric material, such as silicon oxide ($SiO_2$), silicon nitride ($Si_3N_4$), silicon oxynitride (SiON), fluorine-doped silicate glass (FSG), a low-k dielectric material (e.g., with a k-value lower than about 3.9), and/or other suitable dielectric materials with appropriate gap fill properties.

Figure 2:
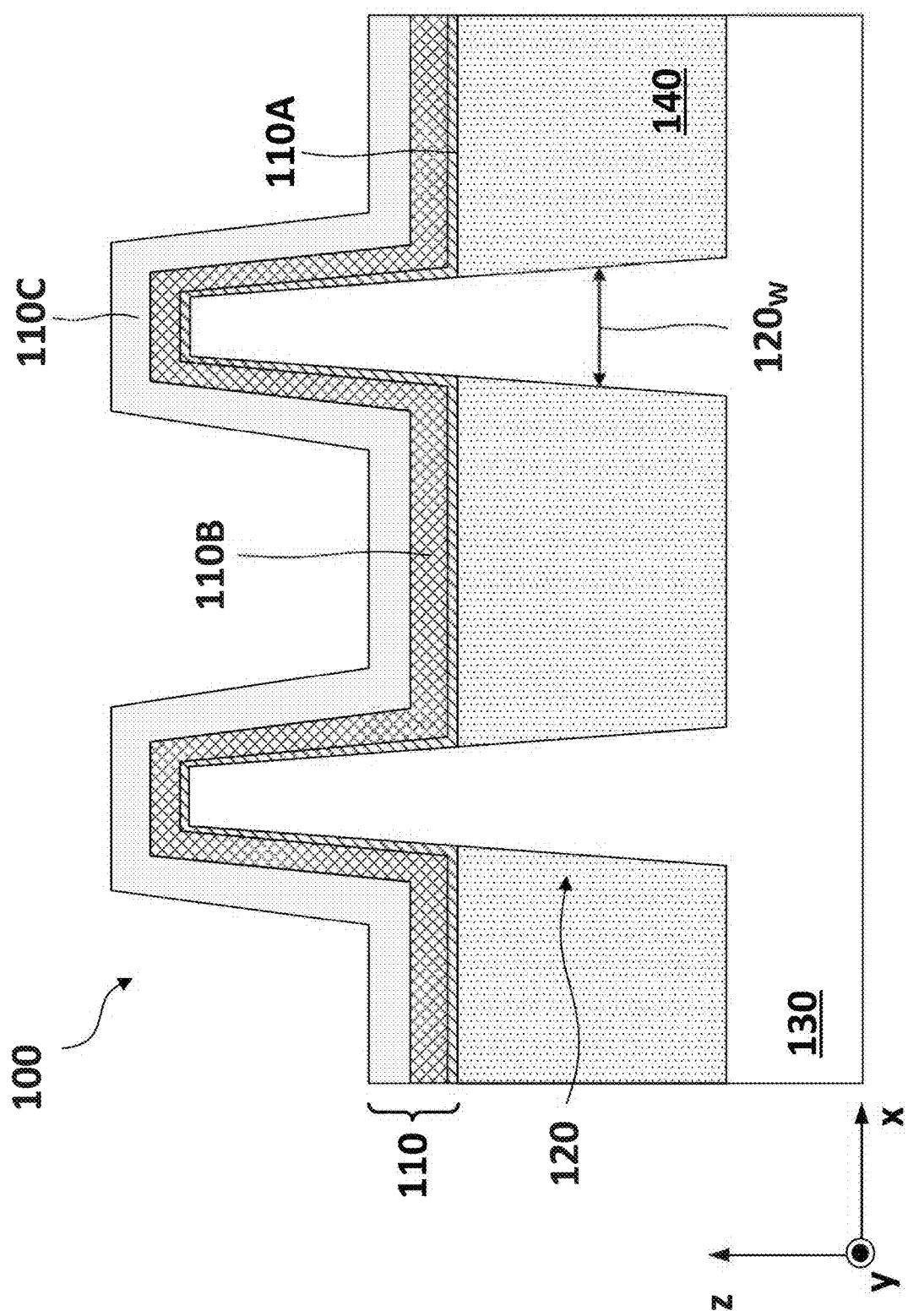
FIG. 2 is a cross-sectional view of a gate stack of a partially fabricated ferroelectric field effect transistor, in accordance with some embodiments.

According to some embodiments, FIG. 2 is a detailed cross-sectional view of gate stack 110 of FeFET 100 shown in FIG. 1 along the x-axis. In FIG. 2, width 120w of fins 120 is shown along the x-axis, while the length of the fins (not shown in FIG. 2) is along the y-axis and perpendicular to the z-x plane, as shown in FIG. 1. Further, in FIG. 2, gate stack 110 is shown with its longest dimension along its length) along the x-axis and parallel to width 120w of fins 120. As shown in FIG. 2, gate stack 110 of FeFET 100 includes several vertically stacked layers. By way of example and not limitation, gate stack 110 can include, but is not be limited to, an interfacial layer 110A, a ferroelectric layer 110B, and a metal gate layer 110C.

Figure 3:
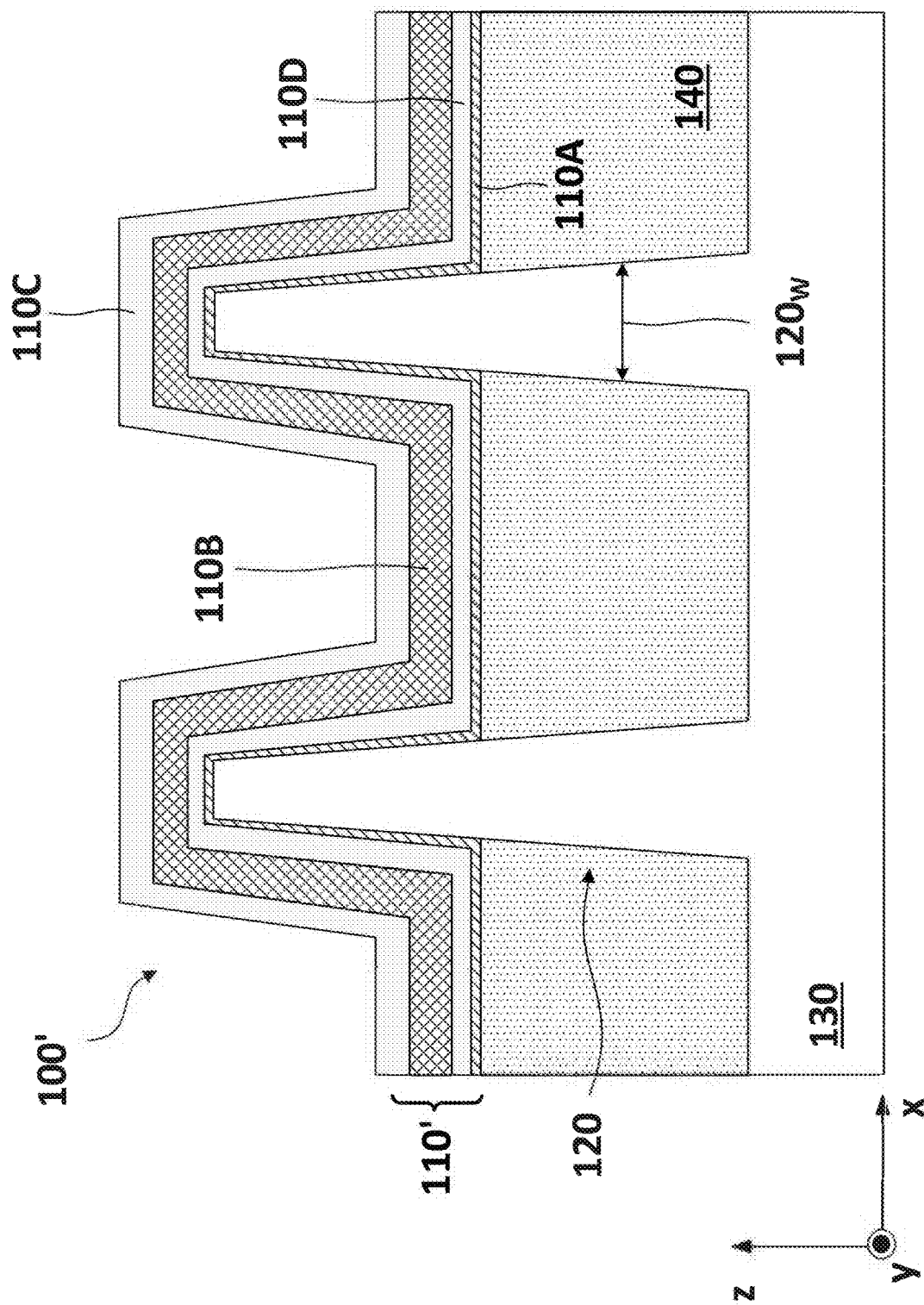
FIG. 3 is a cross-sectional view of a gate stack of a partially fabricated ferroelectric field effect transistor, in accordance with some embodiments.

Gate stack 110 may not be limited to the aforementioned layers and may include additional or fewer layers. For example, FIG. 3 is a cross sectional view of another gate stack 110' having an interfacial layer 110A, a ferroelectric layer 110B, a metal gate layer 110C, and an optional internal metal gate layer 110D interposed between interfacial layer 110A and ferroelectric layer 110B. In some embodiments, metal gate layer 110C may be referred to as "an external metal gate layer" to differentiate it from internal metal gate layer 110D. According to some embodiments, gate stack 110' is part of FeFET 100' that has its ferroelectric layer interposed between two metal gate layers (e.g., metal gate layer 110C and internal metal gate layer 110D). FeFET 100' is referred to as a FeFET with an optional internal metal gate. In some embodiments, FeFET 100' is a variant of FeFET 100 that exhibits improved control over the polarization of ferroelectric layer 110B compared to FeFET 100. This is because in FeFET 100' ferroelectric layer 110B is surrounded by two metal gate layers internal and external metal gate layers 110D and 110C) as opposed to one.

Figure 11:
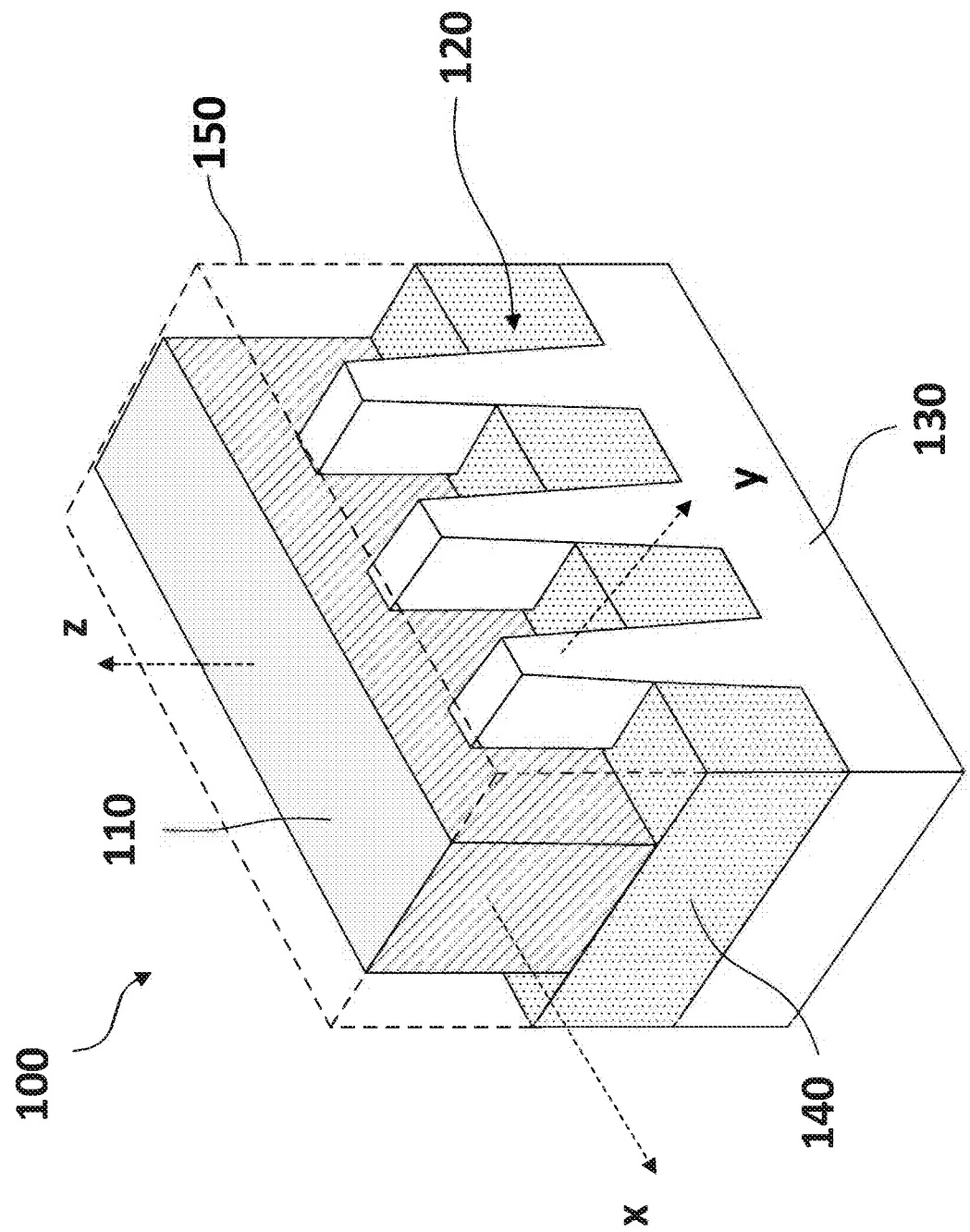
FIG. 11 is an isometric view of a partially fabricated ferroelectric field effect transistor, in accordance with some embodiments.

In some embodiments, interfacial layer 110A includes an oxide-based dielectric with a thickness between about 2 Å and about 50 Å. For example, if fin 120 includes silicon, interfacial layer 110A can include silicon oxide and/or silicon oxynitride. Ferroelectric layer 110B can be a hafnium-based oxide with a high dielectric constant (e.g., a k value higher than about 3.9) and ferroelectric behavior. In some embodiments, ferroelectric layer 1109 can have a thickness between about 10 Å and about 50 Å. In some embodiments, metal gate layers 1100 and 110D include a stack of one or more metal and/or metallic layers including but not limited to titanium, titanium nitride, tantalum, tantalum nitride, titanium-aluminum, tungsten, and cobalt. In some embodiments, metal layer 110C fills the space between fins 120 like in FIG. 11. For example, a top layer in the stack of metal gate layer 110C can be a metal fill thick enough to fill the space between adjacent fins 120 as shown in FIG. 11.

In some embodiments, the formation of gate stack 110 requires ex-situ processes (e.g., vacuum breaks) between the various processing operations. During these intentional vacuum breaks, a metal oxide layer with a thickness between about 0.5 nm and about 1.5 nm can be formed when the deposited metal or metallic layer of the gate stack is exposed to a vacuum break. Oxygen atoms from the metal oxide can diffuse through the metal or metallic layers during a subsequent annealing process such as a PMA process and reach the ferroelectric layer ferroelectric layer 110B). The presence of oxygen in the proximity of the ferroelectric layer can depolarize the ferroelectric layer and deteriorate the FeFET performance.

According to some embodiments, FIG. 4 is a flow chart of a method 400 that can be used when a vacuum break occurs between the metal gate layer deposition and a subsequent PMA. In method 400, a metal oxide layer, formed on the metal gate layer after the metal gate layer deposition due to an unavoidable vacuum break, is removed via etching prior to performing a PMA. The etching and the PMA process in method 400 are performed without a vacuum break (e.g., in-situ). Other fabrication operations may be performed between the various operations of method 400 and may be omitted merely for clarity. Embodiments of the present disclosure are not limited to method 400. Method 400 will be described in reference to FIGS. 4 and 5A-C.

Referring to FIGS. 4 and 5A, method 400 begins with operation 410 and the process of depositing interfacial layer 110A on fin 120. According to some embodiments, FIG. 5A is a partial view of FIG. 2. By way of example and not limitation, interfacial layer 110A can be deposited or grown on fin 120. As discussed above, interfacial layer 110A can be an oxide-based dielectric, such as silicon oxide or silicon oxynitride, with a thickness between about 2 Å and about 50 Å.

In operation 420 shown in FIG. 4, ferroelectric layer 110B is subsequently deposited on interfacial layer 110A. In some embodiments, ferroelectric layer 110B can be deposited by atomic layer deposition (ALD) or any other suitable deposition method capable of forming a ferroelectric layer with a thickness between about 10 Å and about 50 Å. As discussed above, ferroelectric layer 110B can be a hafnium-based oxide that exhibits ferroelectric behavior when it has a crystalline microstructure. In some embodiments, ferroelectric layer 110B has an amorphous microstructure as-deposited in operation 420.

In operation 430 shown in FIG. 4, metal gate layer 110C is deposited on ferroelectric layer 110B as shown in FIG. 5A. In some embodiments, metal gate layer 110C includes a stack of one or more metal and/or metallic layers that include, but are not limited to, titanium, titanium nitride, tantalum, tantalum nitride, titanium-aluminum, tungsten, and cobalt. By way of example and not limitation, metal gate layer HOC can be deposited by ALD, chemical vapor deposition (CVD), or combinations thereof. In some embodiments, after the formation of metal gate layer 110C, the substrate is subjected to a vacuum break before a post metal deposition annealing (PMA). This is because the PMA is performed, for example, in a different reactor from the deposition reactor of metal gate layer 110C. During the aforementioned vacuum break, the top surface of metal gate layer 110C can be oxidized and a metal oxide layer 500 can be formed on metal gate layer 110C as shown in FIG. 5A. In some embodiments, the PMA is performed to crystallize ferroelectric layer 110B since ferroelectric layer 110B may be amorphous as-deposited.

Referring to FIG. 4, method 400 continues with operation 440 and the process of exposing metal layer 110C to a treatment with a metal-halide gas (indicated by light gray arrows in FIG. 5B) so that metal oxide layer 500 shown in FIG. 5A is entirely, or substantially, removed as shown in FIG. 5B. Operations represented by figures enclosed within a dashed line labeled "in-situ" are performed without a vacuum break and operations represented by figures outside the dashed line labeled "in-situ" are performed with a vacuum break. For example, operations described in FIGS. 5B and 5C are performed in-situ (e.g., without a vacuum break). Accordingly, operations described in FIG. 5A are performed ex-situ (e.g., with a vacuum break) with respect to operations described in FIGS. 5B and 5C. As discussed above, operation 440 is performed in a different reactor from that of the metal gate layer deposition. In some embodiments, the metal-halide gas includes a transition metal such as tungsten or tantalum. By way of example and not limitation, the metal-halide gas can include tungsten hexafluoride ($WF_6$), tantalum pentafluoride ($TaF_5$), tungsten pentachloride ($WCl_5$), or tantalum pentachloride ($TaCl_5$).

In some embodiments, the metal-halide gas treatment is performed at a temperature between about 350° C. and about 600° C. In some embodiments, the reactivity between the metal-halide gas and metal oxide layer 500 is limited for temperatures below 350° C.—e.g., the etching rate is low and metal oxide layer 500 is etched slowly or not at all. On the other hand, at temperatures above 600° C. the metal-halide gas may decompose. In some embodiments, the reactivity between the metal-halide gas and metal oxide layer 500 increases with the treatment temperature (e.g., the reactivity increases closer to about 600° C.).

In some embodiments, operation 440 is performed at a process pressure between about 1 Torr and about 100 Torr.

According to some embodiments, different metal-halide gases have different oxide etching rates under similar processing conditions (e.g., under identical treatment temperature and process pressure). For example, $WCl_5$ can be more reactive than $TaCl_5$. Therefore, the treatment time can be adjusted according to the metal-halide gas used in operation 440. In some embodiments, the exposure time can vary between about 10 s and about 600 s depending on the metal-halide gas etching rate, the thickness of metal oxide layer 500, the temperature at which the treatment is performed, and the process pressure. For example, shorter treatment times may be selected for metal-halide gases having higher etching rates (e.g., $WCl_5$), thinner metal oxide (e.g., closer to about 0.5 nm), higher treatment temperatures (e.g., closer to about 600° C.), and higher process pressure (e.g., closer to about 100 Torr). Conversely, longer treatment times may be selected for metal-halide gases with a lower etching rates (e.g., $TaCl_5$), thicker metal oxides (e.g., closer to about 1.5 nm), lower treatment temperatures (e.g., closer to about 400° C.), and lower process pressure (e.g., closer to about 1 Torr). The aforementioned process condition combinations are exemplary and other combinations of different process conditions (e.g., time, temperature, and type of metal-halide gas) can be used depending on the thickness of the metal oxide layer to be removed. These other combinations are within the spirit and the scope of this disclosure.

In some embodiments, after the treatment of operation 440, traces of the halide species (e.g., chlorine or fluorine) detectable on the surface of metal gate layer 110C (e.g., detectable by an analytical technique such as x-ray photoelectron spectroscopy (XPS), auger electron spectroscopy (AES), or energy dispersive spectroscopy (EDS)) can range between about 0.5 atomic percentage ("at. %") and about 5 at. %. A halide (e.g., chlorine or fluorine) concentration higher than about 5 at. % is considered a contaminant and should be avoided since higher levels of halide in metal gate layer 110C can diffuse into ferroelectric layer 110B (and interfacial layer 110A) and impact the FeFET's operation. In some embodiments, a treatment at higher temperature and process pressure (e.g., closer to about 600° C. and about 100 Torr) favors low detectable amounts of halide (e.g., closer to about 0.5 at, %). In referring to FIG. 4, method 400 continues with operation 450 and the process of performing a PMA without a vacuum break (e.g., in-situ with operation 440) as shown in FIG. 5C and indicated by the wavy lines. In some embodiments, the PMA of operation 450 is performed at a temperature between 500° C. and 1000° C. to crystallize ferroelectric layer 110B. By way of example and not limitation, the PMA in operation 450 is performed in an ambient that includes nitrogen, ammonia, hydrogen, argon, helium, or combinations thereof, Since metal oxide layer 500 has been substantially, or entirely, removed (e.g., etched) during operation 440 shown in FIG. 5B, there is no (or minimal) oxygen diffusion into ferroelectric layer 110B, and therefore the polarization of ferroelectric layer 110B is preserved.

Once ferroelectric layer 110B has been crystallized by the PMA process in operation 450, gate stack 110 can be exposed to air through a vacuum break process. At this point, any new metal oxide formation on metal gate layer 110C will not impact the performance of FeFET 100.

Figure 6:
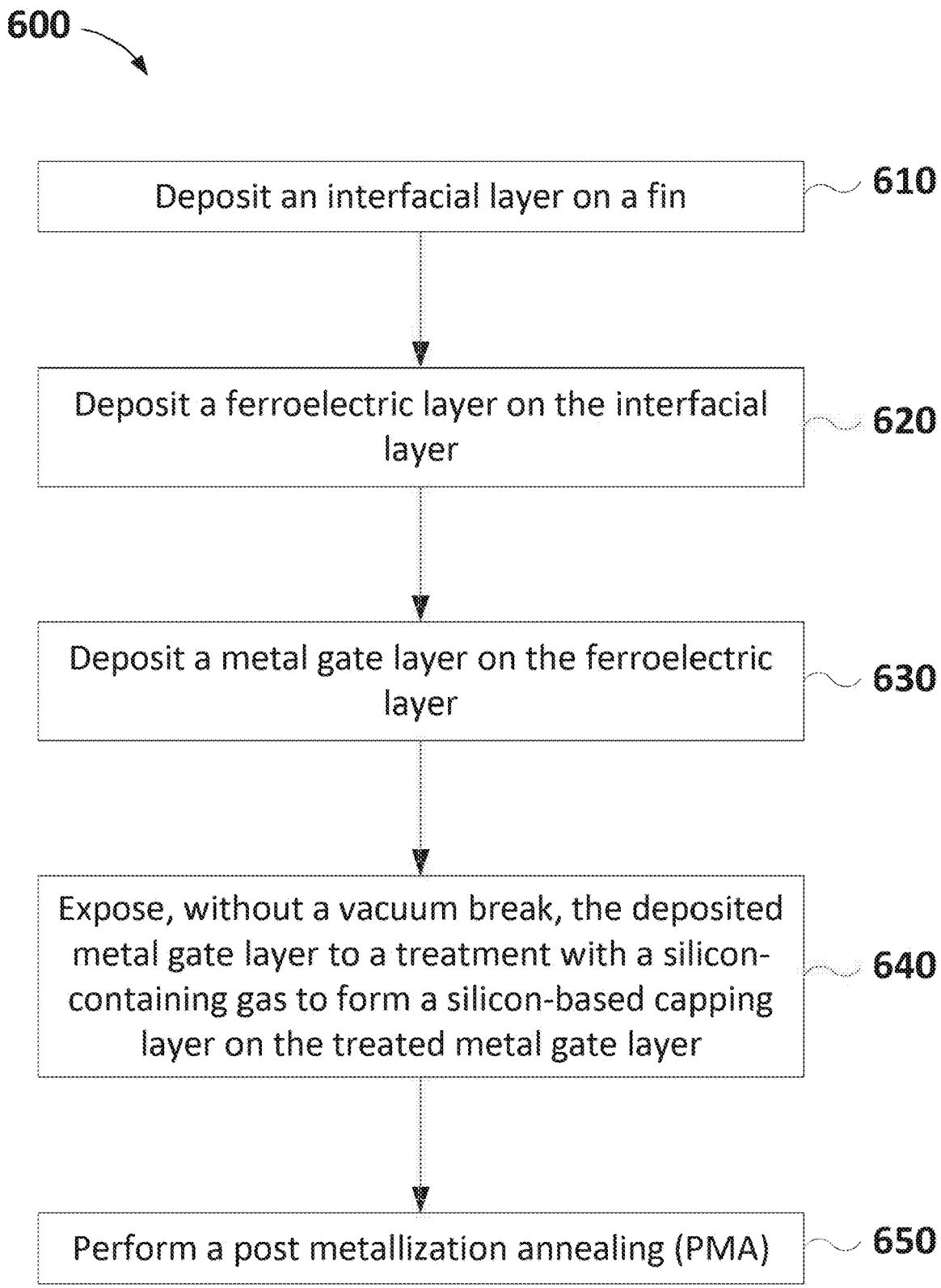
FIG. 6 is a flow chart of a method for eliminating or mitigating the formation of a metal oxide on a metal gate layer of a gate stack of a partially fabricated ferroelectric field effect transistor, in accordance with some embodiments.

According to some embodiments, FIG. 6 is a flow chart of a method 600, which is an alternative to method 400 described above. In method 600, after the metal gate layer deposition, the deposited metal gate layer is exposed, without a vacuum break, to a silicon-containing gas to form a silicon-based protective layer on the metal gate layer. The silicon-based protective layer can prevent oxidation of the underlying metal gate layer in the event of a vacuum break prior to the PMA process. Other fabrication operations may be performed between the various operations of method 600 and may be omitted merely for clarity. Embodiments of the present disclosure are not limited to method 600. Method 600 will be described in reference to FIGS. 6 and 7A-D.

In some embodiments, methods 600 and 400 share common operations. For example, operation 610 is similar to operation 410, operation 620 is similar to operation 420, and operation 630 is similar to operation 430. Therefore, description of method 600 will begin with operation 640. In some embodiments, operations 610 and 620 are described in FIG. 7A and operation 630 is described in FIG. 7B.

Referring to FIG. 6, method 600 continues with operation 640 and the process of exposing the deposited metal gate layer 110C, without a vacuum break, to a treatment with a silicon-containing gas, as indicated by the dark grey arrows shown in FIG. 7C, to form a silicon-based capping layer 700 on metal gate layer 110C. Operation 640, shown in FIG. 7C, is performed in-situ (e.g., without a vacuum break) with the metal gate layer deposition process to avoid exposing the deposited metal gate layer 110C to a vacuum break (e.g., to atmospheric oxygen). In some embodiments, the in-situ processing can be achieved by performing the treatment of operation 640 in the metal gate deposition reactor or, alternatively, within the same cluster tool where a vacuum break (e.g., air exposure) can be avoided.

By way of example and not limitation, the silicon-containing gas can include silane ($SiH_4$), disilane ($Si_2H_6$), or any other suitable silicon-containing gas that can with react with metal gate layer 110C and form silicon-capping layer 700, which acts as an oxygen barrier that prevents the formation of a metal oxide on metal gate layer 110C after a vacuum break prior to the PMA.

In some embodiments, operation 640 described in FIG. 7C can be performed at a process temperature between about 350° C. and 600° C., which is similar to the temperature of operation 440 discussed for method 400 shown in FIG. 4. In some embodiments, for temperatures below 350° C., the thermal energy provided is insufficient to initiate a reaction between the silicon-based gas and the metal gate layer. In some embodiments, formation of a silicon-based capping layer is possible below 350° C. if a radio frequency (RF) or direct current (DC) plasma is used with a power between about 200 W and about 1000 W. In some embodiments, for temperatures above 600° C., the silicon-based gas can dissociate prior to reaching the surface of gate metal layer 110C, which can be detrimental to the formation of the silicon-based capping layer.

In some embodiments, the exposure time can range from about 10 s to about 600 s depending on the desired thickness of silicon-based capping layer 700. In some embodiments, the silicon-based capping layer has a thickness between about 2 Å and about 20 Å. In some embodiments, silicon-based capping layers thinner than about 2 Å cannot protect metal gate layer 110C from oxidation, while silicon-based capping layers thicker than about 20 Å occupy valuable space, which would otherwise be occupied by other layers of gate stack 110.

Referring to FIG. 6, method 600 concludes with operation 650 and the process of performing a PMA. In some embodiments, operation 650 is similar to operation 450 of method 400 shown in FIG. 4. Further, the structures of FIG. 5C and FIG. 7D are similar with the exception of silicon-based capping layer 700 on metal gate layer 110C of FIG. 7D.

In some embodiments, silicon-based capping layer 700 is not sacrificial. In other words it is not removed after the PMA process and can remain on metal gate layer 1100 during the remainder of the fabrication process.

Based on the above, methods 400 and 600 provide alternative approaches to avoid depolarization of ferroelectric layer 110B when a vacuum break occurs between the deposition of metal gate layer 110C and the PMA, For example, method 400 utilizes a metal-halide gas treatment to remove oxide layer 500, formed by a vacuum break on metal gate layer 110C, prior to a PMA that is performed in-situ with the metal-halide gas treatment. On the other hand, method 600 utilizes a silicon-based capping layer, grown after the formation of metal gate layer 110C without a vacuum break, to prevent the formation of a metal oxide on metal gate layer 110C prior to an ex-situ PMA process.

In some embodiments, for FeFET structures that include an internal metal gate layer, as shown in FIG. 2 for FeFET 100', methods 400 and 600 shown in FIGS. 4 and 6 respectively can be combined. For example, FIG. 8 is a flow chart of method 800 that can be applied to FeFETs having an internal metal gate layer, like FeFET 100' shown in FIG. 2. Other fabrication operations may be performed between the various operations of method 800 and may be omitted merely for clarity. Embodiments of the present disclosure are not limited to method 800. Method 800 will be described in reference to FIGS. 8 and 9A-F. In some embodiments, method 800 is a combination of methods 400 and 600 shown in FIGS. 4 and 6.

Referring to FIGS. 8 and 9A, method 800 begins with operation 810 and the process of depositing interfacial layer 110A and internal metal gate layer 110D on fin 120. In some embodiments, and as discussed above, internal metal gate layer 110D can be similar to metal gate layer 110C in terms of deposition methods and layers. FIG. 9A shows the resulting structure after operation 810. In some embodiments, during a subsequent vacuum break, oxide layer 500 is formed on internal metal gate layer 110D as shown in FIG. 9A. This is because the internal metal gate layer deposition is performed in a different reactor than the ferroelectric layer deposition which follows. Therefore, a vacuum break is necessary between the internal metal gate layer deposition and a subsequent ferroelectric layer deposition.

Referring to FIGS. 8 and 9B, method 800 continues with operation 820 and the process of exposing the deposited internal metal gate layer 110D to a treatment with a metal-halide gas, as shown in FIG. 9B and indicated by the light gray arrows, to remove metal oxide layer 500 prior to the deposition of a ferroelectric layer in a subsequent operation. In some embodiments, operation 820 can be similar to or different from operation 440 of method 400 shown in FIG. 4 in terms of the process conditions (e.g., the selection of the metal-halide gas, the treatment time, the temperature, the process pressure, the thickness of the metal oxide to be removed, or combinations thereof).

Referring to FIGS. 8 and 9C, method 800 continues with operation 830 and the process of depositing ferroelectric layer 110B on the treated internal metal gate layer 110D without a vacuum break. In some embodiments, the deposition process of ferroelectric layer 110B of operation 830 is similar to operations 420 and 620 of methods 400 and 600 respectively shown in FIGS. 4 and 6.

Referring to FIGS. 8 and 9D, method 800 continues with operation 840 and the process of depositing external metal gate layer 110C ex-situ on ferroelectric layer 110B. In some embodiments, the deposition process of metal gate layer 110C of operation 840 is similar to operations 430 and 630 of operations 400 and 600 respectively shown in FIGS. 4 and 6.

Referring to FIGS. 8 and 9E, method 800 continues with operation 850 and the process of exposing the deposited metal gate layer 110C to a treatment with a silicon-containing gas without a vacuum break (e.g., in-situ), as indicated by dark gray arrows shown in FIG. 9E, to form a silicon-based capping layer 700 on metal gate layer 110C. According to some embodiments, the silicon-containing gas and the process conditions of operation 850 can be similar to operation 640 of method 600 shown in FIG. 6.

Referring to FIGS. 8 and 9F, method 800 continues with operation 860 and the process of performing a PMA after a vacuum break. As discussed above, since the PMA process is performed ex-situ with respect to the metal gate layer deposition, a silicon-based capping layer is necessary to protect the surface of metal gate layer from oxidation due to the vacuum break between the metal gate layer deposition process and the PMA process.

Based on the above, and referring to FIGS. 9A-9F, method 800 utilizes a halide-metal gas treatment to remove metal oxide layer 500 from internal metal gate layer 110D prior to ferroelectric layer 110B deposition, and a silicon-based capping layer 700 to protect the surface of the metal gate layer 110C from oxidation prior to the ex-situ PMA process.

In some embodiments, variations of method 800 are possible. For example, FIG. 10A, similarly to FIG. 9A, shows the resulting structure after operation 810 and the deposition of interfacial layer 110A and internal metal gate layer 110D, After operation 820—where the metal-halide gas treatment of internal metal gate layer 110D removes metal oxide layer 500 as shown in FIG. 10B (e.g., similarly to FIG. 9B)—internal metal gate layer 110D can be exposed to an in-situ treatment with silicon-containing gas, as shown in FIG. 10C and indicated by the dark grey arrows, to form a silicon based-capping layer 1000 on the treated internal metal gate layer 110D. The aforementioned treatment with the silicon-containing gas and the subsequent formation of silicon based-capping layer 1000 can be similar to operation 640 of method 600 shown in FIG. 6. However, in this modification of method 800, the metal-halide gas treatment, the silicon-containing gas and silicon based-capping layer 1000 are operations performed without a vacuum break—e.g., in-situ. In some embodiments, the formation of silicon-based capping layer 1000 has the added benefit of preventing the formation of an interfacial metal oxide layer between the top surface of internal metal gate layer 110D and ferroelectric layer 110B in the event that such metal oxide formation is not desired. The modified method 800 may resume with operations 830 through 860 of method 800 shown in FIG. 8 and the resulting structure is shown in FIG. 10E.

It is noted that in the aforementioned modified version of method 800, ferroelectric layer HOB is not deposited on internal metal gate layer 110D (like in method 800) but on the newly formed silicon-based cap layer 1000 as shown in FIG. 10D. Further, the aforementioned modified version of method 800 introduces a second silicon-based capping layer (e.g., silicon-based cap layer 1000) as shown in the final structure of FIG. 10E.

The embodiments described herein are not limited to methods 400, 600, 800, and the modification of method 800 described above. Combination and permutations of these methods and their respective operations are possible, and these combinations and permutations are within the spirit and the scope of this disclosure.

Embodiments of the present disclosure are directed to methods that can eliminate, or minimize, the formation of an oxide on the metal gate layers of FeFETs due to vacuum breaks during the formation of the gate stack. In some embodiments, the method described herein includes a halide-based gas treatment that removes the metal oxide formed on the metal gate layer prior to an PMA process. In some embodiments, the metal gate layer is subjected to a silicon-contained gas treatment that forms a protective silicon-based capping layer on the metal gate layer prior to the PMA process. In some embodiments, if the FeFET includes an internal metal gate layer, the internal metal gate layer can be subjected to a metal-halide gas treatment to remove the metal oxide formed on the internal metal gate layer and later the external metal gate layer can be subjected to a silicon-contained gas treatment to form silicon-based capping layer prior to a PMA process. Alternatively, the internal metal gate layer can be subjected to a metal-halide gas treatment following the internal metal gate layer deposition and to a silicon-contained gas treatment to form a silicon-based capping layer prior to the formation of the ferroelectric layer. In some embodiments, the methods described herein are applicable to several types of transistors, such as finFETs and gate all around (GAA) FETs (e.g., nano-sheet FETs and nano-wire FETs).

In some embodiments, a method includes providing a substrate with fins thereon; depositing an interfacial layer on the fins; depositing a ferroelectric layer on the interfacial layer; depositing a metal gate layer on the ferroelectric layer; exposing the metal gate layer to a metal-halide gas; and performing a post metallization annealing, where the exposing the metal gate layer to the metal-halide gas and the performing the post metallization annealing occur without a vacuum break.

In some embodiments, a method includes providing a substrate with fins thereon, depositing an interfacial layer on the fins, depositing a first metal gate layer, and performing a first in-situ process which includes treating the first metal gate layer with a metal halide gas and depositing a ferroelectric layer on the treated first metal gate layer. The method further includes performing a second in-situ process that includes forming a second metal gate layer on the ferroelectric layer and treating the second metal gate layer with a silicon-based gas to deposit a silicon-based capping layer on the second metal gate layer. The method further includes annealing the substrate to crystallize the ferroelectric layer.

In some embodiments, a semiconductor structure includes a substrate with fins thereon; a dielectric layer disposed on the substrate and covering bottom side surfaces of the fins; and a gate stack on the fins, where the gate stack includes an interfacial layer on side surfaces of the fins not covered by the dielectric layer, a ferroelectric layer on the interfacial layer, a first metal gate layer on the ferroelectric layer; and a first silicon-based capping layer on the first metal gate layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    depositing an interfacial oxide layer on a fin structure;
    depositing a first metal gate layer on the interfacial oxide layer;
    performing a first in-situ process, comprising:
        treating the first metal gate layer with a metal halide gas, and
        depositing a ferroelectric layer on the treated first metal gate layer;
    performing a second in-situ process comprising:
        depositing a second metal gate layer on the ferroelectric layer; and
        forming a silicon-based capping layer on the second metal gate layer.

2. The method of claim 1, wherein depositing the ferroelectric layer comprises depositing an amorphous ferroelectric layer.

3. The method of claim 1, further comprising performing an annealing process to crystallize the ferroelectric layer.

4. The method of claim 1, further comprising performing an ex-situ annealing process after forming the silicon-based capping layer.

5. The method of claim 1, further comprising breaking a vacuum between performing the first and second in-situ processes.

6. The method of claim 1, wherein forming the silicon-based capping layer comprises treating the second metal gate layer with a silicon-based gas.

7. The method of claim 1, wherein forming the silicon-based capping layer comprises exposing the second metal gate layer to silane or disilane at a temperature between about 350° C. and about 600° C.

8. The method of claim 1, wherein forming the silicon-based capping layer comprises depositing a silicon layer, a silicon carbide layer, a silicon nitride layer, or a silicide layer on the second metal gate layer.

9. The method of claim 1, wherein treating the first metal gate layer comprises exposing the first metal gate layer to tungsten hexafluoride ($WF_6$), tantalum pentafluoride ($TaF_5$), tungsten pentachloride ($WCl_5$), or tantalum pentachloride ($TaCl_5$) at a temperature between about 350° C. and about 600° C.

10. The method of claim 1, wherein treating the first metal gate layer comprises exposing the first metal gate layer to a metal-halide gas including a transition metal at a temperature between about 350° C. and about 600° C.

11. A method, comprising:
    depositing a first metal gate layer on a fin structure;
    performing an etch process on the first metal gate layer with a metal halide gas;
    depositing a ferroelectric layer on the first metal gate layer;
    depositing a second metal gate layer on the ferroelectric layer; and
    forming a silicon-based capping layer on the second metal gate layer.

12. The method of claim 11, wherein performing the etch process and depositing the ferroelectric layer are in-situ processes.

13. The method of claim 11, wherein depositing the second metal gate layer and forming the silicon-based capping layer are in-situ processes.

14. The method of claim 11, further comprising performing an annealing process after forming the silicon-based capping layer to crystallize the ferroelectric layer.

15. The method of claim 11, wherein forming the silicon-based capping layer comprises treating the second metal gate layer with a silicon-based gas.

16. The method of claim 11, wherein forming the silicon-based capping layer comprises depositing a silicon layer, a silicon carbide layer, a silicon nitride layer, or a silicide layer on the second metal gate layer.

17. A method, comprising:
    forming an interfacial oxide layer on a fin structure;

depositing a ferroelectric layer on the interfacial oxide layer;

performing an in-situ process, comprising:
- depositing a metal gate layer on the ferroelectric layer, and
- forming a silicon-based capping layer on the metal gate layer; and performing an annealing process on the silicon-based capping layer.

18. The method of claim 17, wherein forming the silicon-based capping layer comprises depositing a silicon layer, a silicon carbide layer, a silicon nitride layer, or a silicide layer on the metal gate layer.

19. The method of claim 17, wherein depositing the ferroelectric layer comprises depositing an amorphous hafnium-based dielectric layer.

20. The method of claim 17, wherein performing the annealing process comprises crystallizing the ferroelectric layer.

* * * * *

UNITED STATES PATENT AND TRADEMARK OFFICE
CERTIFICATE OF CORRECTION

PATENT NO. : 12,034,058 B2
APPLICATION NO. : 18/129961
DATED : July 9, 2024
INVENTOR(S) : Lin et al.

It is certified that error appears in the above-identified patent and that said Letters Patent is hereby corrected as shown below:

On the Title Page

Column 1, under "Related U.S. Application Data", delete "(60)" and insert -- (63) --, therefor.

In the Specification

In Column 5, Line 8, delete "1109" and insert -- 110B --, therefor.

In Column 5, Line 10, delete "1100" and insert -- 110C --, therefor.

In Column 5, Line 27, delete "ferroelectric layer" and insert -- (e.g., ferroelectric layer --, therefor.

In Column 6, Line 4, delete "HOC" and insert -- 110C --, therefor.

In Column 7, Line 34, delete "thereof," and insert -- thereof. --, therefor.

In Column 8, Line 57, delete "PMA," and insert -- PMA. --, therefor.

In Column 10, Line 38, delete "HOB" and insert -- 110B --, therefor.

Signed and Sealed this
First Day of October, 2024

Katherine Kelly Vidal
*Director of the United States Patent and Trademark Office*